United States Patent
Marki et al.

(10) Patent No.: US 11,869,858 B2
(45) Date of Patent: Jan. 9, 2024

(54) PACKAGING HIGH-FREQUENCY MICROWAVE CIRCUITS USING HOT VIA DIE ATTACH WITH INTERPOSER

(71) Applicant: Marki Microwave, Inc., Morgan Hill, CA (US)

(72) Inventors: Christopher Ferenc Marki, Morgan Hill, CA (US); Jeff Luu, Morgan Hill, CA (US); Douglas Ryan Jorgesen, Morgan Hill, CA (US)

(73) Assignee: Marki Microwave, Inc., Morgan Hill, CA (US)

( * ) Notice: Subject to any disclaimer, the term of this patent is extended or adjusted under 35 U.S.C. 154(b) by 124 days.

(21) Appl. No.: 17/569,460

(22) Filed: Jan. 5, 2022

(65) Prior Publication Data

US 2023/0215823 A1 Jul. 6, 2023

(51) Int. Cl.
 H01L 23/495 (2006.01)
 H01L 23/538 (2006.01)
 H01L 23/66 (2006.01)
 H01L 23/055 (2006.01)
 H01L 23/498 (2006.01)
 H01L 21/50 (2006.01)

(52) U.S. Cl.
 CPC ............... *H01L 23/66* (2013.01); *H01L 21/50* (2013.01); *H01L 23/49531* (2013.01); *H01L 23/5384* (2013.01)

(58) Field of Classification Search
 CPC ............. H01L 23/055; H01L 23/49531; H01L 23/49548; H01L 23/49827; H01L 23/49861; H01L 23/5384; H01L 23/66
 See application file for complete search history.

(56) References Cited

U.S. PATENT DOCUMENTS

| | | | |
|---|---|---|---|
| 2011/0163919 A1* | 7/2011 | Suzuki | H01L 23/66 361/818 |
| 2014/0110841 A1* | 4/2014 | Beer | H01L 23/49822 257/738 |
| 2014/0268625 A1* | 9/2014 | Sherrer | H01L 23/66 252/514 |
| 2019/0371746 A1* | 12/2019 | Mahon | H01L 23/66 |
| 2020/0176416 A1* | 6/2020 | Ketterson | H01L 23/5226 |
| 2021/0225719 A1* | 7/2021 | Seler | H01L 23/49816 |

* cited by examiner

*Primary Examiner* — Omar F Mojaddedi
(74) *Attorney, Agent, or Firm* — Fenwick & West LLP (57) ABSTRACT

Microwave packaging uses signal vias and interposers, such as metal lead frame interposers. For example, the microwave circuit die includes signal vias that electrically connect the top side and the bottom side of the die. Microwave signal circuitry on the die have signal paths that are electrically connected to the top side of the signal vias. The microwave signal circuitry typically may have an operating frequency of 300 MHz or faster. The bottom side of the signal vias are electrically connected to corresponding areas on the top side of the interposer. The bottom side of the die may also include a ground plane, with ground vias that electrically connect the top side of the die to the ground plane.

11 Claims, 6 Drawing Sheets

PACKAGING HIGH-FREQUENCY MICROWAVE CIRCUITS USING HOT VIA DIE ATTACH WITH INTERPOSER

BACKGROUND

1. Technical Field

This disclosure relates generally to packaging of microwave circuits.

2. Description of Related Art

Microchip packaging is the electromechanical structures that electrically connect various integrated circuits (IC) while also providing them with mechanical stability and physical protection. Many efforts today to improve IC packaging focus on techniques to enable higher density by packaging more IC capability into smaller physical footprint, to thus reduce overall size, weight, power consumption, and cost.

Packaging poses special challenges for microwave circuits, including monolithic microwave integrated circuits (MMICs), due in part to their analog nature and operation at high frequencies. Currently, most MMICs utilize wire bond packaging, in which circuitry on the MIMIC die are connected to the printed circuit board via wires that are bonded to pads on the MIMIC die. However, the use of wire bonding in conjunction with a surface mount package can adversely impact the electrical performance of the MIMIC chip, particularly if the chip is operated at high frequencies. In addition, wire bonding as a manufacturing method is slow because each wire is individually bonded to the corresponding bond pad. It also requires a fair amount of area outside the die itself, and the density of the wire bonds is limited, especially when interposers are used. As a result, wire bonded MIMIC packages are limited in terms of achievable frequency performance and chip-to-package area utilization.

Flip chip packaging is another package technology. In flip chip packaging, solder bumps are deposited on pads on the top side of the MMIC die during the final wafer processing step. In order to mount the MMIC die to external circuitry, it is flipped over so that the top side with the solder bumps faces down. The MIMIC die is aligned so that the solder bumps align with matching pads on the printed circuit board. The solder is reflowed to complete the interconnect. However, flip chip packaging can pose challenges for high-performance MMICs. Advanced, sophisticated laminate processing techniques may be required to achieve high frequency operation. They may also pose thermal challenges. Heat sinking from the MMIC die may be difficult in this face-down configuration. In addition, the die and the underlying circuit board may have different rates of thermal expansion, causing unwanted stress between the two.

Thus, there is a need for better packaging technologies for microwave devices.

SUMMARY

In one aspect, microwave packaging uses signal vias (sometimes referred to as hot vias) and interposers. The microwave circuit die includes one or more signal vias that electrically connect the top side and the bottom side of the die. Microwave signal circuitry on the die have signal paths that are electrically connected to the top side of the signal vias. The microwave signal circuitry typically has an operating frequency of 300 MHz or higher, and may be active and/or passive circuitry. The bottom side of the signal vias are electrically connected to the top side of the interposer. As an example, the interposer may be a metal lead frame interposer. The bottom side of the microwave circuit die may also include a ground plane, with ground vias that electrically connect the top side of the die to the ground plane.

These types of packages may be fabricated using chip-scale fabrication. For example, a wafer may be diced into individual dies, each of which is then pick and placed onto a lead frame array for die mounting and final encapsulation. The lead frame array may then be diced into individual microwave packages.

Other aspects include components, devices, systems, improvements, methods, processes, applications, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed. The following examples will be illustrated using monolithic microwave integrated circuit (MMIC) dies, but other types of microwave circuit dies may also be used. For example, the microwave circuit dies may contain passive and/or active components.

Figure 1A:
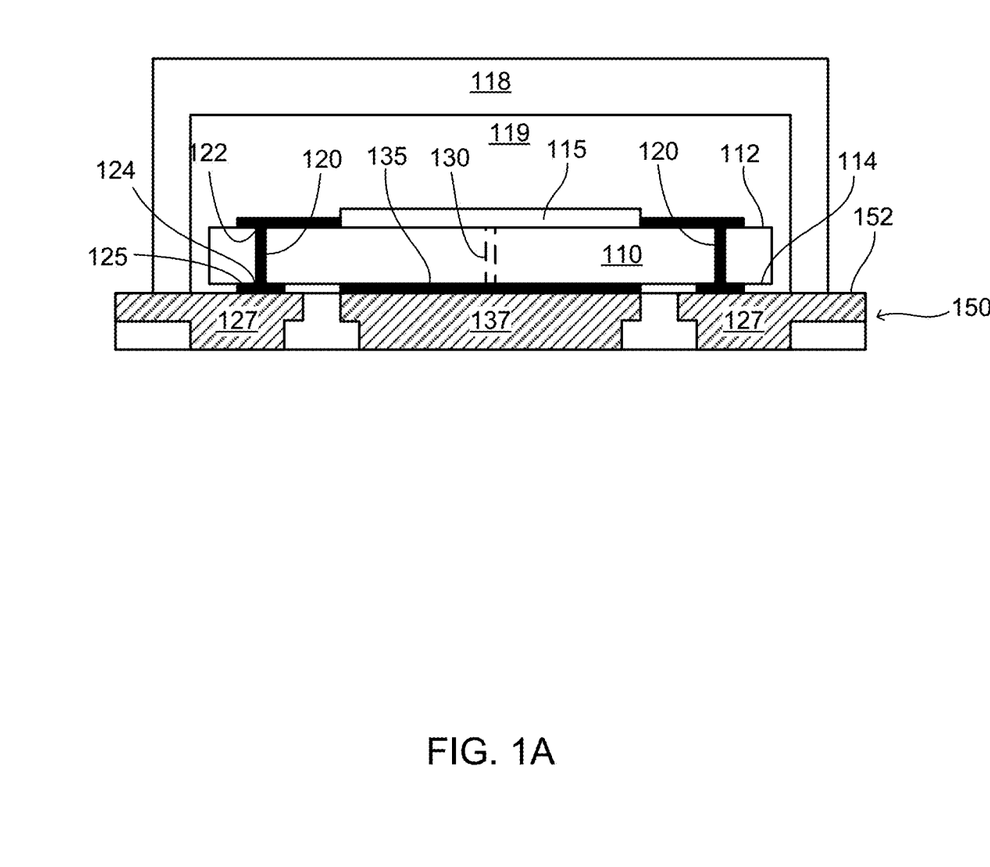
FIG. 1A is a cross section of a MMIC package with signal vias and an interposer.

FIG. 1A is a cross section of a MMIC package with signal vias and an interposer. The package includes a MMIC die 110 and an interposer 150, which in this example is a metal lead frame. The MIMIC die 110 has a top side 112 and a bottom side 114, with vias 120 through the die connecting the top side and bottom side. Microwave signal circuitry 115 have signal paths that are electrically connected to the top side 122 of the signal vias, for example by metal interconnects routed on the top side. In FIG. 1A, the circuitry 115 and vias 120 are spatially separated for clarity, but that is not required. The circuitry 115 and vias 120 may be interspersed. The signal paths may carry data and/or control signals. The bottom side 124 of the signal vias are electrically connected to connection pads 125, which in turn are electrically connected to corresponding leads 127 on the top side 152 of the lead frame interposer 150.

The MIMIC die 110 may also have a ground plane 135 on its bottom side 114. The ground plane 135 is electrically connected to the top side 112 of the MIMIC die by ground vias 130, which are shown as dashed in FIG. 1. The ground plane 135 is also electrically connected to a corresponding lead 137 of the interposer 150. In FIG. 1, the metal leads 127, 137 of interposer 150 are shown as cross-hatched. The remaining white area is plastic or dielectric, which provides structural support for the interposer.

The terms "top" and "bottom" refer to specific sides of the die, and are not meant to limit the physical orientation of the die. The top side 112 is also known as the front side. It is the side that is processed to create the circuitry 115. It will be referred to as the top side, regardless if it is facing up, down, or in other directions. The bottom side 114 or back side is the less processed side of the die, although it may be thinned or processed to create simple structures such as the connection pads 125 and ground plane 135. The die 110 determines the "top" and "bottom" directions, and this then defines the top and bottom sides of the interposer and other structures.

The MMIC die 110 may be attached to the interposer 150 using different techniques. In this example, a solder reflow is used. Die adhesive and conductive epoxy may also be used. Alternatively, stud bumps, ball bumps, bump bonding, copper pillars or other connection structures may be used.

The MMIC die 110 is also processed to protect it from the physical environment. In this example, the package includes a lid 118, which forms an air cavity 119 over the die 110. Passivation, encapsulation and/or overmolding may also be used.

Figure 1B:
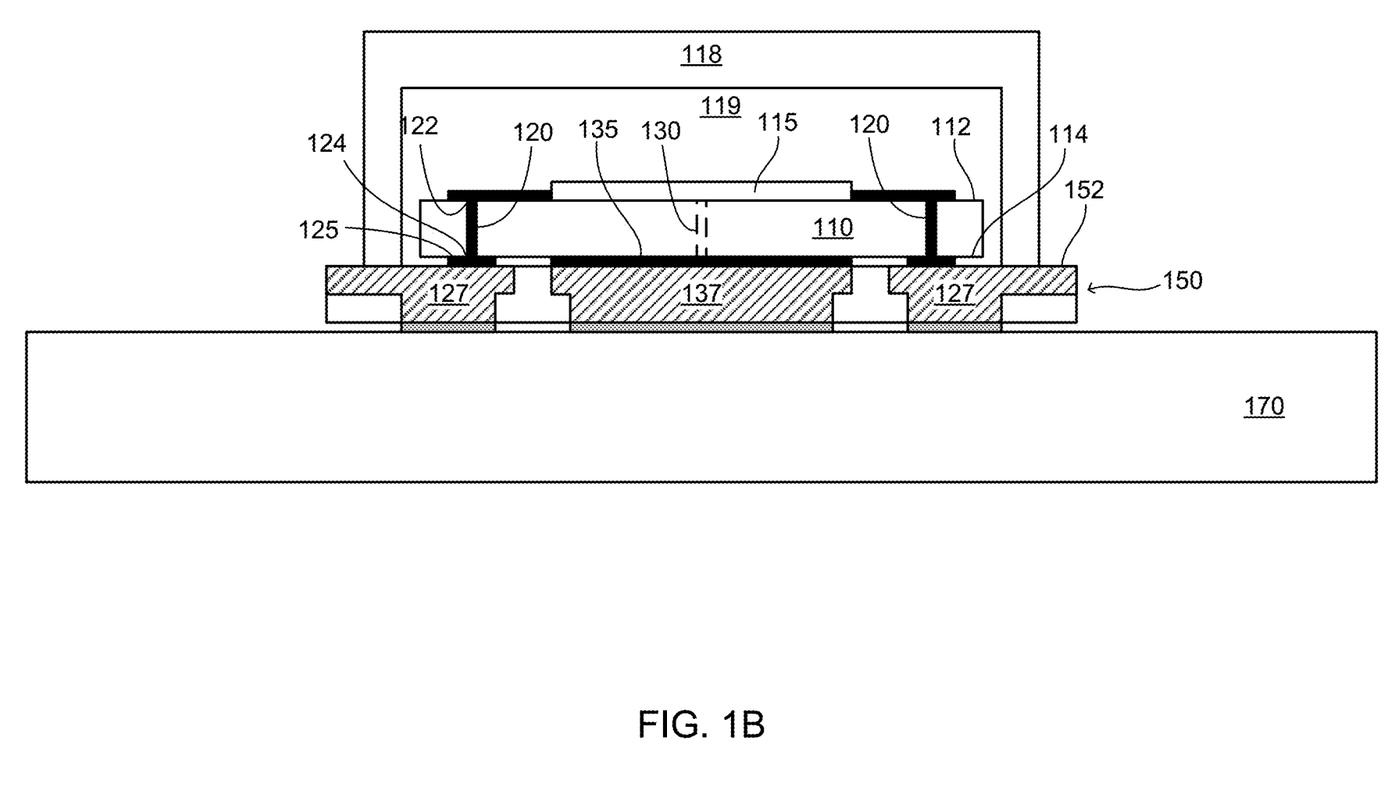
FIG. 1B is a cross section of a MIMIC package mounted on a printed circuit board.

FIG. 1B is a cross section of the MMIC package of FIG. 1A mounted on a printed circuit board 170. In this example, the lead frame interposer 150 is directly attached to the printed circuit board 170. In other systems, the electrical connection may be indirect via a second-level interposer between the lead frame interposer 150 and the board 170. The electrical connections from the bottom side of the metal leads 127, 137 to the printed circuit board 170 are shown in FIG. 1B.

Figure 2A:
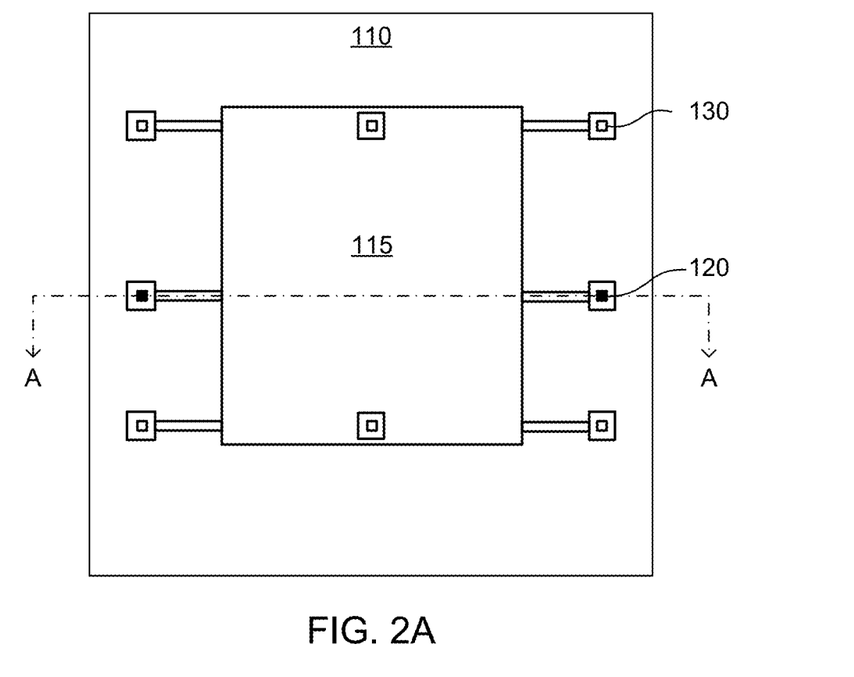
FIGS. 2A and 2B are plan views of the top side and bottom side of a MMIC die.
Figure 2B:
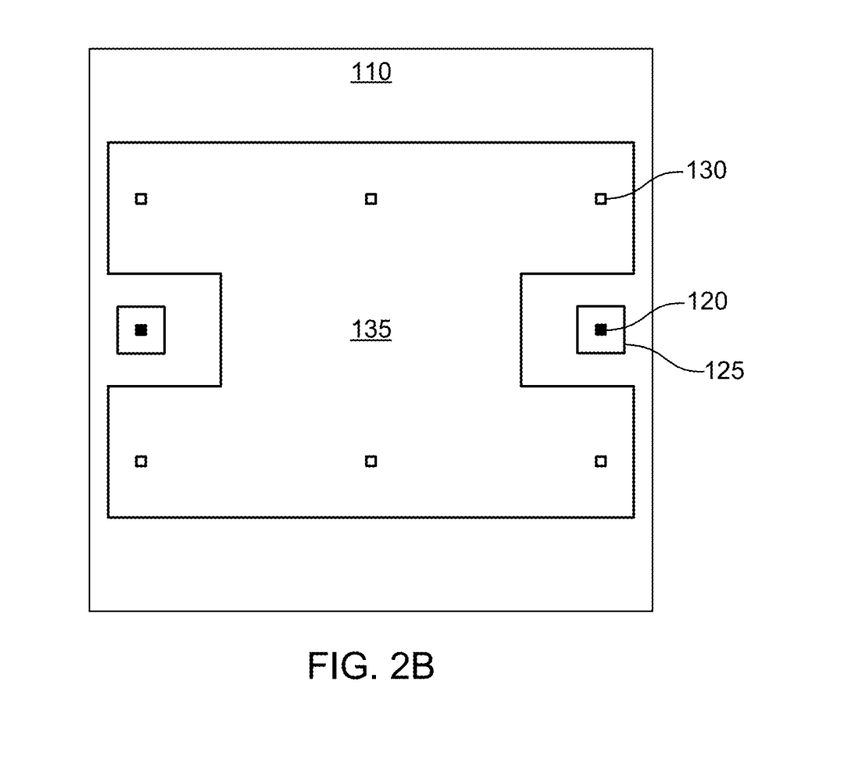

FIGS. 2A and 2B show additional details of the via structures. FIG. 2A shows a plan view of the top side 112 of the MMIC die 110, and FIG. 2B shows a plan view of the bottom side 114. The cross sections of FIGS. 1A and 1B are taken through section A-A. In these figures, the signal vias 120 are shown as small solid squares, and the ground vias 130 are shown as small hollow squares for purposes of illustration. In actual construction, vias may be filled or unfilled. Vias are vertical electrical connections that pass completely through a die. As shown in FIG. 1, a conductively plated via may be used to create an electrical path between a point 122 on the top side of a die to a connection pad 125 on the bottom side of the die, which will be referred to as signal vias or hot vias 120 for paths that carry signals. Vias may also be used to create an electrical path between a point on the top surface of a die to an electrical ground plane 135 on the bottom surface (ground vias 130). By patterning the semiconductor substrate back side ground plane 135 to separate the ground path from the signal or hot path, the die 110 can be mounted face-up on the interposer 150 and signals may be routed through the microwave circuitry 115 through the signal vias 120. This combines the advantages of face-up die mounting with the advantages of denser interconnects. In addition, because the signal vias are formed during wafer processing, the technique can be massively parallel, low cost, and extremely accurate with high yield.

These figures show two signal vias 120, which may provide a signal path for two ports of a microwave circuit 115. The signal may enter the circuit by one via and exit the circuit by the other via. Other configurations of circuits, ports and vias are also possible. For example, there may be only a single via. This may be the case if the microwave circuit 115 is reflective or has a termination, such as a 50 ohm load.

In this example, the die 110 in these figures is a MIMIC die. MMICs are a type of analog integrated circuit that operates at microwave frequencies, typically 300 MHz to 300 GHz although other frequencies are also possible. MMICs typically perform functions such as microwave signal mixing, power amplification, low-noise amplification, signal filtering, analog signal processing and high-frequency switching. These devices may be used in systems such as phased array antennas, unmanned aerial vehicles, and mm-wave communications.

High-performance MMICs and other microwave circuits may be made from III-V semiconductor compounds. III-V materials are alloys containing elements from groups III and V in the periodic table, including gallium arsenide (GaAs), indium phosphide (InP), and gallium nitride (GaN). Such III-V MMICs can have many benefits in high-frequency and high-performance applications over more traditional silicon (Si) and silicon germanium (SiGe) compounds: faster transistor speed that can be important at high frequencies, better electrical insulating properties to be able to operate at higher voltages, and better thermal properties so they can operate at the higher temperatures often accompanying high-power operations. However, III-V compound MMICs often have greater material fragility, may operate at higher temperatures, and often have different thermal expansion coefficients than other materials like silicon substrates to which they may be attached.

The packages described herein may have many advantages in mitigating these challenges compared to other packaging technologies, such as wire bonding or flip chip bonding. For example, in these packages, the MIMIC die 110 is mounted "face-up" (not flip chipped) to the interposer 150. MMICs mounted face-up allow robust thermal sinking through the direct contact between the bottom side of the (usually thinned) die into the substrate below. The ground plane may also provide a large area of direct thermal contact. In addition, many existing process development kits (PDKs) for MMICs have been created to support "face-up" grounded transmission line topologies. These PDKs may be used to develop these packages, thus avoiding the costly and time-consuming task of having to develop custom models. Another advantage of the approach described here is that many III-V processes use air-bridges for metal crossovers to reduce parasitic capacitance and so improve high frequency transistor operation. However, air-bridges are fragile. Some technologies may require epoxy underfill, which can damage the air-bridges, whereas these packages can be constructed without epoxy underfill.

Furthermore, the feature sizes of the structures in these packages are smaller than for other packaging approaches (e.g. compare to wire bonding). Therefore, these packages can achieve higher operating frequencies, such as 100 GHz or higher. They can also be more densely packed, achieving a package area that is no more than 1.2 times the die area, which is an area utilization of chip area to package area of 83%. Area utilizations of 60-90% are achievable. This can be important for smaller die sizes, for example dies that are 2 mm×2 mm or smaller. This approach is also amenable to chip-scale fabrication, which can reduce cost and increase yield.

In the example of FIG. 1, the MIMIC die 110 is mounted to a metal lead frame interposer 150. The use of an interposer 150 avoids problems associated with directly mounting a MIMIC die onto a printed circuit board. Because III-V die are very thin, they are fragile and delicate to handle. As such, a direct mounting of the fragile die onto a printed circuit board would be more difficult and would require scrutiny during environmental stress screening. Furthermore, failure modes associated with III-V coefficient of thermal expansion in relation to other materials (i.e., a difference in the rate at which a material expands or contracts with changes in temperature) and process variation can result in yield loss and low reliability. These challenges can limit the use of direct mount assemblies in high-frequency and high-performance MMICs.

However, traditional interposers are based on silicon or laminates, both of which can be unsuitable for high-frequency and high-performance MMICs. The addition of an interposer layer will introduce additional parasitic inductances and capacitances. At a minimum, these must be properly accounted for to prevent signal reflections and maintain signal integrity, and such additional inductances may limit the high frequency operation of the interconnects even if compensated.

Silicon interposer technologies have significant drawbacks when applied to high-frequency III-V MMICs. High frequency signals have high loss on silicon due to its semi-insulating (rather than completely insulating) characteristics. Silicon is also expensive to develop on and has limited availability for low to medium volume applications, which are more typical of MMICs. Silicon interposers also use through-silicon-vias, which make it difficult to align and match to the signal vias in the III-V MIMIC dies without introducing signal reflections and so degrading performance.

Laminate interposer technologies also have significant challenges. Standard laminate fabrication techniques struggle to meet the small feature sizes commensurate with hot via technology. Specifically, the filled via dimensions required to facilitate signal routing and first level interconnection in a laminate interposer must be small and precisely controlled. Due to manufacturing limitations in via-diameter-to-substrate-thickness aspect ratio, this limits laminate interposers to only very thin interposers. These are difficult to handle and easily become warped (i.e., non-flat) as the die area increases.

Figure 2C:
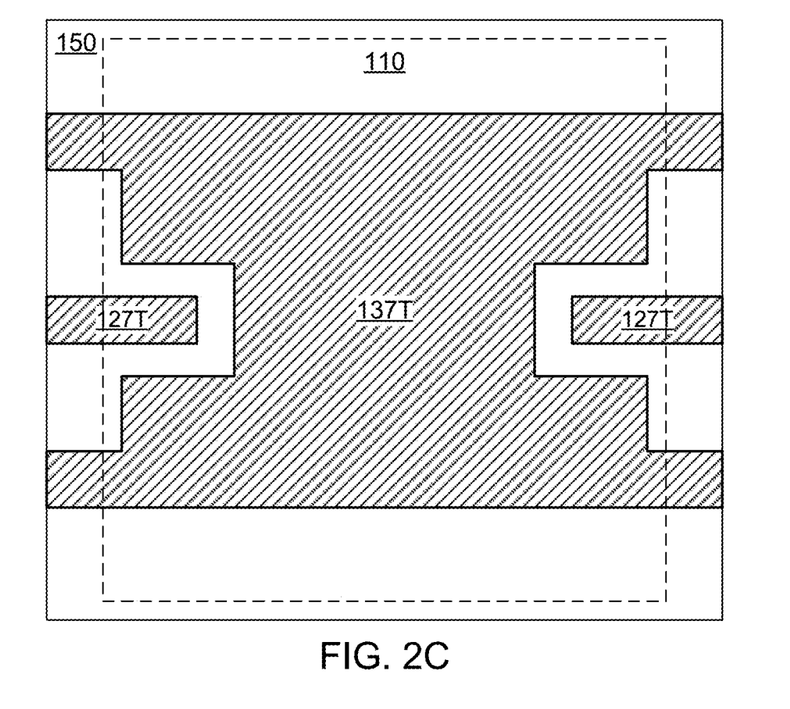
FIGS. 2C and 2D are plan views of the top side and bottom side of a metal lead frame interposer.
Figure 2D:
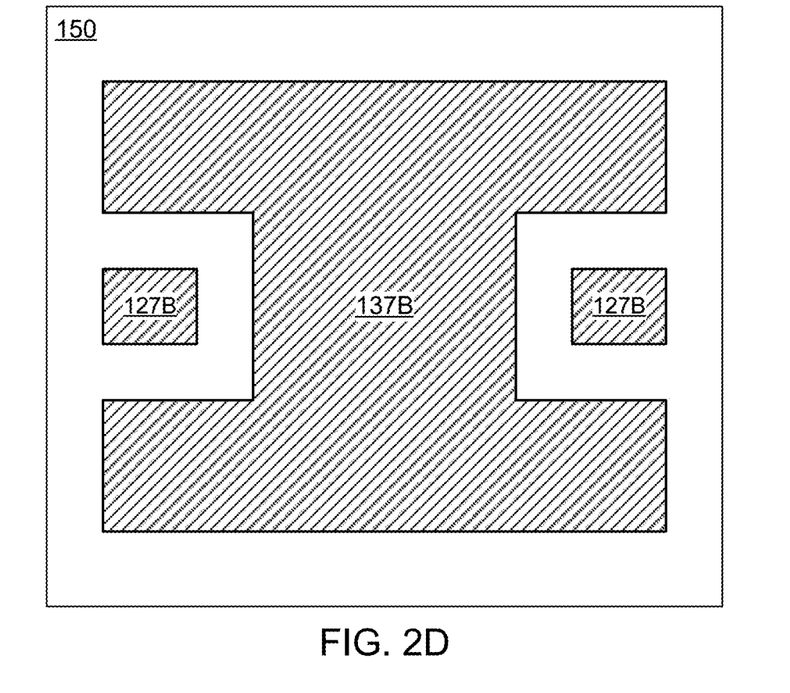

FIGS. 2C and 2D are plan views of the top side and bottom side of the metal lead frame interposer. In these figures, metal leads 127 connect to the signal vias 120 and connection pads 125. Metal leads 137 connect to the ground plane 135 and ground vias 130. The suffix T and B indicate whether the shape shown is for the top side or the bottom side of the metal lead frame interposer. In FIG. 2C, the dashed line 110 shows the footprint of the MMIC die. The metal lead frame interposers are constructed as an array of metal lead frames. The solid line 150 shows the outline of a basic cell in the array.

Figure 3:
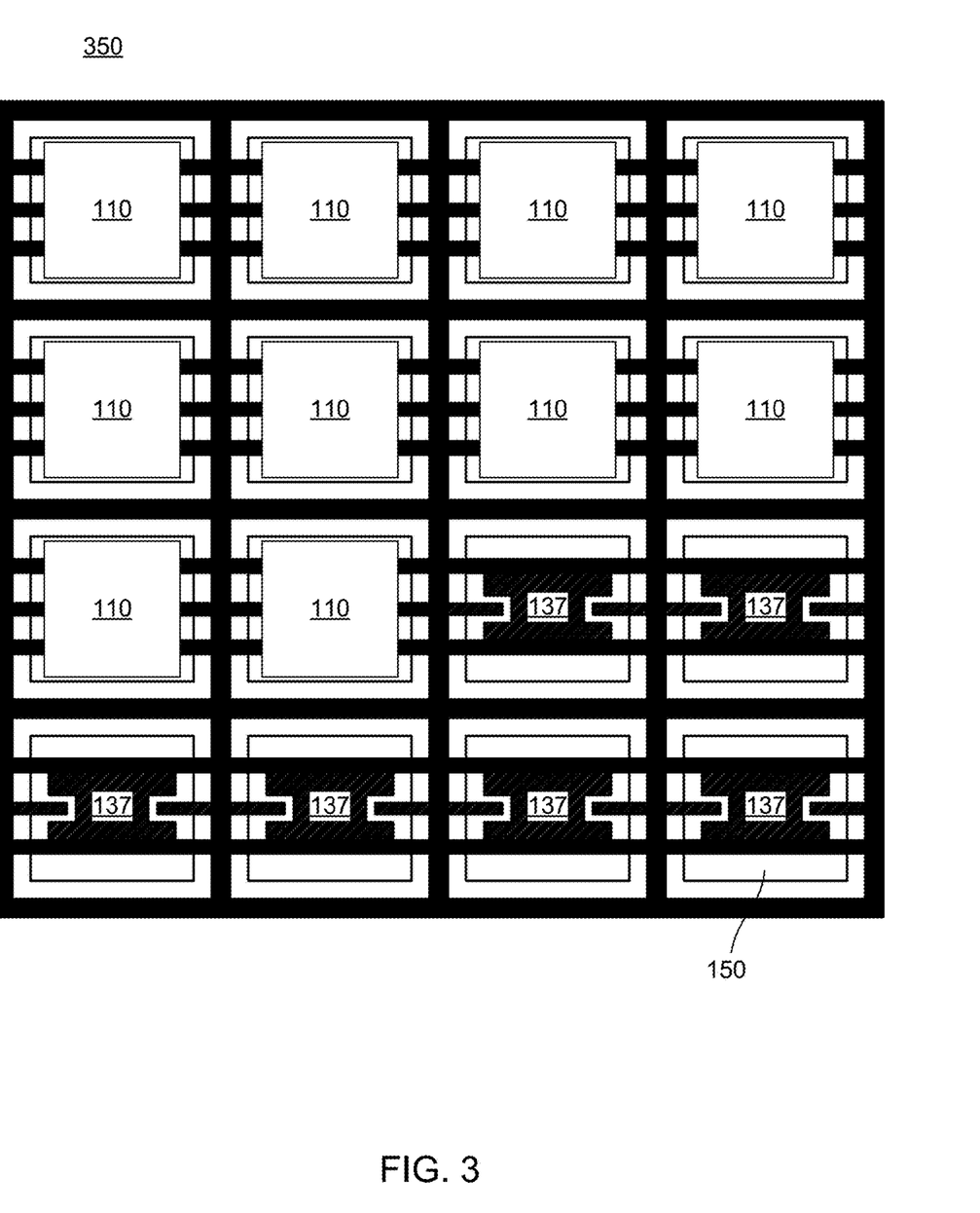
FIG. 3 is a top view of a lead frame array.

FIG. 3 shows a top view of a 4×4 array 350 of lead frames. In this figure, the metal leads are shown as black. The basic structure shown in FIG. 2C is apparent, and the large ground lead 137 is labeled in FIG. 3. The individual lead frames 150 are connected to each other to form the array 350. In FIG. 3, MMIC dies 110 have been attached to some of the lead frames, starting from the upper left. After the MMIC dies are attached and encapsulated, the array is diced into individual MMIC packages. Because lead frame assembly techniques are highly parallel and automated, large scale and low cost are possible. The use of metal lead frame interposers overcomes the semi-insulating penalty of silicon interposers while also avoiding the fabrication resolution and board warping concerns of laminate interposers.

Figure 4:
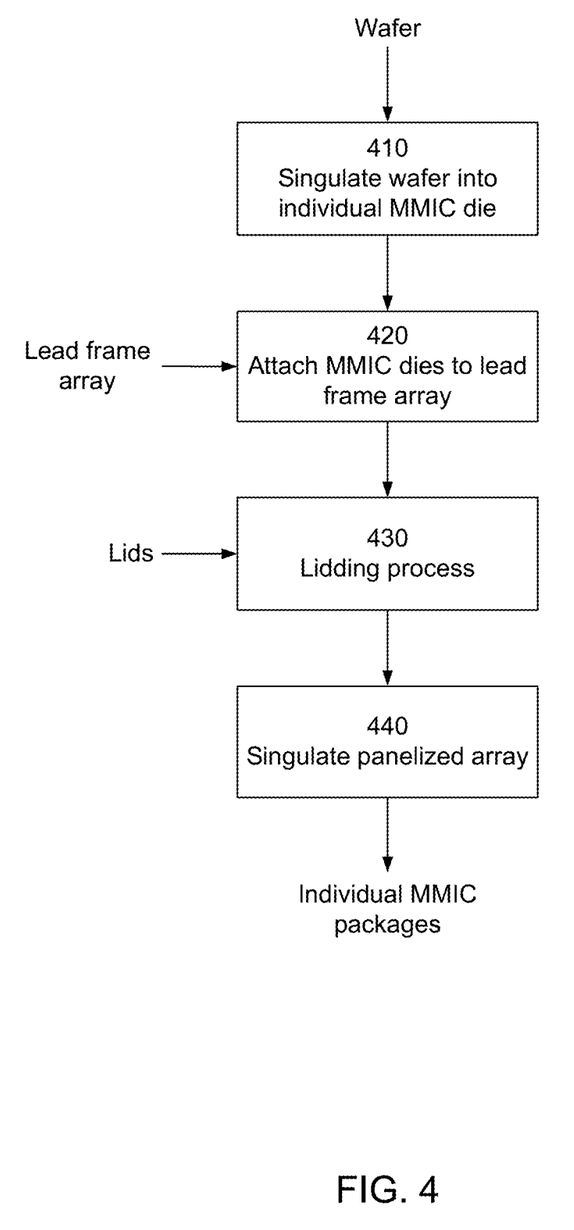
FIG. 4 is a flow diagram of chip-scale packaging of MMIC chips.

FIG. 4 is a flow diagram of chip-scale packaging of MMIC chips, which may also be applied to other microwave circuits. A wafer contains an array of MIMIC die. These are singulated 410 into individual MMIC die. The individual MMIC die are attached 420 to corresponding lead frame interposers, which are contained as an array. This can be done using an automated process. A lid is attached 430 to protect the MMIC die while also providing an air cavity over the die. Alternatively, the lead frame and attached die may be overmolded using an epoxy resin compound. Providing for an air cavity may be useful in certain applications where the die cannot be covered by overmolding or epoxy compound, for example to protect air-bridges for metal crossovers used to reduce parasitic capacitance and so improve high frequency transistor operation. The panelized array is then singulated 440 to create individual packaged dies.

Lead frame interposers used with hot via die attach can offer advantages over other possible interposer approaches. Lead frames are metal, typically copper-based, and therefore have excellent thermal sinking characteristics compared to other interposer substrates. A metal lead frame is also typically thinner than interposer approaches based on other substrates. Metal lead frames may be on the order of 200 um thick. Such thin lead frames can be accurately fabricated with fine feature sizes that can accommodate operating frequencies of 100 GHz or higher. Further, the thinner the lead frame, the shorter the thermal path through the interposer to a potential heat sink.

In addition, the lead frame may be made with plastic molded over a metal frame. As a result, the metal frame can have shapes made with a "double etch" process, in which the resulting shapes on the top side and bottom side of the metal frame may be different, as if etched from both the top and bottom. For example, in FIGS. 2C and 2D, the gap between the top side signal pad 127T and ground pad 137T is narrower, which has better electrical performance but requires tighter tolerances to attach correctly. Because the top and bottom sides may be shaped differently, the bottom side signal pad 127B and ground pad 137B may be made larger, which relaxes the tolerance when attaching to the printed circuit board. The larger gap on the bottom side is less important for overall electrical performance. This is in contrast to other interposers based on dielectric substrate materials, where the metal used for signal and ground conduction is either plated or filled and so must be uniform in one dimension. Having such dimensional flexibility has distinct advantages. It allows for more control over the high frequency electrical design of the interposer, reducing adverse parasitic effects and signal reflections. It also allows for smaller pads on the top side (for the hot via attach) and simultaneously larger pads on the bottom side to make it easier for surface-mount or other techniques to attach to the second level interposer or printed circuit board.

Besides metal lead frame interposers, alternative embodiments for the interposer include ceramic interposers, thin film interposers, and glass interposers. These alternate interposers also overcome the limitations inherent with silicon-based or laminate interposers when used with high-frequency MMICs or other microwave circuits.

Ceramic may be a suitable interposer choice for high-frequency microwave circuits because it is an excellent insulator that is rigid, and because it supports fine geometry traces, gaps, and vias. In this case, the die may be attached to the ceramic interposer substrate by solder or epoxy, and the signal paths and ground contact pads are routed through the ceramic layer(s) using vias and traces to the bottom layer. Whether the ceramic interposer is composed of a single layer or multiple layers is determined by the application and requirement. The microwave circuit die is then protected from the environment, typically either through an epoxy encapsulation or lidding step. The package is then ready for the eventual second-level attachment. It should be noted that thin film processing extends beyond just ceramics. Other thin film technologies may also be used. For example, aluminum nitride has an advantage of high thermal conductivity.

Glass may also be a suitable interposer choice. Glass is an excellent insulator and therefore offers high frequency coverage. Glass offers excellent mechanical stiffness and has a coefficient of thermal expansion that closely matches III-V materials like GaAs and GaN. Glass interposers can be processed on larger wafers (at least 200 mm). Glass interposer technology can be combined with integrated passive devices, such as inductors, to allow for higher levels of integration. Glass also supports fine geometry lines and gaps with via aspect ratios as high as 10:1. This makes glass well suited for microwave circuit packaging because the I/O density and fabrication accuracy is highly compatible with standard hot via IC dimensions and provides a path towards extremely high frequency of operation.

Many features of glass interposers are similar to those used in ceramic interposers, including the following. Hot via die may be attached to a high-quality substrate using epoxy, solder, or flip-chip techniques. Signal routing from the top side of the interposer to the bottom layer allows for second level interconnection. Similar techniques may be used to protect the exposed IC die. High frequency and/or small form factor is possible using a face-up die attach method.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A device comprising:
   a microwave circuit die having a top side and a bottom side, the microwave circuit die comprising:
   a signal via that electrically connects the top side and the bottom side of the die;
   microwave signal circuitry having a signal path that is electrically connected to the top side of the signal via, the microwave signal circuitry having an operating frequency of at least 300 MHz; and
   a connection pad on the bottom side of the die that is electrically connected to the bottom side of the signal via; and
   a metal lead frame interposer having a top side and a bottom side, the connection pad on the bottom side of the die electrically connected to a corresponding area on the top side of the interposer.

2. The device of claim 1 wherein the die further comprises:
   a ground plane on the bottom side of the die, the ground plane electrically connected to a corresponding area on the top side of the interposer; and
   one or more ground vias that electrically connect the top side of the die to the ground plane on the bottom side of the die.

3. The device of claim 1 wherein the microwave signal circuitry has an operating frequency of at least 100 GHz.

4. The device of claim 1 wherein the microwave signal circuitry includes at least one of a signal mixer, a power amplifier, a low-noise amplifier, a signal filter, an analog signal processor and a high-frequency switch.

5. The device of claim 1 wherein the microwave signal circuitry is passive circuitry.

6. The device of claim 1 wherein the die contains exactly one signal via that is electrically connected to the microwave signal circuitry.

7. The device of claim 1 wherein the microwave signal circuitry comprises III-V signal circuitry.

8. The device of claim 1 wherein the leads of the metal lead frame interposer have different shapes on the top side and the bottom side of the metal lead frame interposer.

9. The device of claim 1 wherein the metal lead frame interposer has a thickness of not more than 200 um.

10. The device of claim 1 wherein the die is a passivated die, an encapsulated die, an overmolded die or further comprises a lid that forms an air cavity over the die.

11. The device of claim 1 wherein the connection pad on the bottom side of the die is attached to the corresponding area on the top side of the interposer by solder, by epoxy, by stud bumps, by ball bumps, or by copper pillars.

* * * * *